United States Patent
Khaja et al.

(10) Patent No.: US 10,083,818 B2
(45) Date of Patent: Sep. 25, 2018

(54) AUTO FREQUENCY TUNED REMOTE PLASMA SOURCE

(71) Applicant: Applied Materials, Inc., Santa Clara, CA (US)

(72) Inventors: Abdul Aziz Khaja, San Jose, CA (US); Mohamad A. Ayoub, Los Gatos, CA (US); Ramesh Bokka, Milpitas, CA (US); Jay D. Pinson, II, San Jose, CA (US); Juan Carlos Rocha-Alvarez, San Carlos, CA (US)

(73) Assignee: Applied Materials, Inc., Santa Clara, CA (US)

(*) Notice: Subject to any disclaimer, the term of this patent is extended or adjusted under 35 U.S.C. 154(b) by 20 days.

(21) Appl. No.: 14/863,153

(22) Filed: Sep. 23, 2015

(65) Prior Publication Data

US 2016/0086772 A1    Mar. 24, 2016

Related U.S. Application Data

(60) Provisional application No. 62/054,902, filed on Sep. 24, 2014.

(51) Int. Cl.
*H01J 37/32*    (2006.01)

(52) U.S. Cl.
CPC ...... *H01J 37/32183* (2013.01); *H01J 37/321* (2013.01); *H01J 37/3211* (2013.01); *H01J 37/32155* (2013.01); *H01J 37/32357* (2013.01); *H01J 37/32458* (2013.01)

(58) Field of Classification Search
None
See application file for complete search history.

(56) References Cited

U.S. PATENT DOCUMENTS

| | | | | |
|---|---|---|---|---|
| 5,897,713 | A * | 4/1999 | Tomioka | C23C 16/401 118/723 I |
| 6,150,628 | A | 11/2000 | Smith et al. | |
| 6,535,785 | B2 * | 3/2003 | Johnson | H01J 37/32082 156/345.28 |
| 8,742,665 | B2 * | 6/2014 | Lubomirsky | H01J 37/32357 216/63 |
| 8,771,538 | B2 * | 7/2014 | Lubomirsky | H01J 37/32357 156/345.24 |
| 9,466,469 | B2 * | 10/2016 | Khaja | H01J 37/32458 |
| 2009/0001890 | A1 * | 1/2009 | Singh | H01J 37/321 315/111.21 |
| 2013/0278140 | A1 * | 10/2013 | Mudunuri | H05H 1/46 315/111.21 |
| 2014/0265856 | A1 * | 9/2014 | Hahto | H01J 27/022 315/111.41 |

* cited by examiner

*Primary Examiner* — Douglas W Owens
*Assistant Examiner* — Srinivas Sathiraju
(74) *Attorney, Agent, or Firm* — Patterson + Sheridan, LLP

(57) ABSTRACT

A remote plasma source is disclosed that includes a core element and a first plasma block including one or more surfaces at least partially enclosing an annular-shaped plasma generating region that is disposed around a first portion of the core element. The remote plasma source further comprises one or more coils disposed around respective second portions of the core element. The remote plasma source further includes an RF power source configured to drive a RF power signal onto the one or more coils that is based on a determined impedance of the plasma generating region. Energy from the RF power signal is coupled with the plasma generating region via the one or more coils and the core element.

19 Claims, 10 Drawing Sheets

AUTO FREQUENCY TUNED REMOTE PLASMA SOURCE

CROSS-REFERENCE TO RELATED APPLICATIONS

This application claims benefit of U.S. provisional patent application Ser. No. 62/054,902, filed Sep. 24, 2014, entitled "Auto Frequency Tuned Remote Plasma Source," which is herein incorporated by reference.

BACKGROUND

Field of the Disclosure

Embodiments disclosed herein generally relate to plasma processing systems and materials and apparatus for controlling plasma uniformity in plasma processing systems.

Description of the Related Art

Plasma processing chambers are regularly utilized in various electronic device fabrication processes, such as etching processes, chemical vapor deposition (CVD) processes, and other processes related to the manufacture of electronic devices on substrates. Many ways have been employed to generate and/or control the plasma density, shape, and electrical characteristics in processing chambers, such as capacitively or inductively coupled RF sources commonly used in conventional plasma chambers. For example, during a plasma-enhanced chemical vapor deposition (PECVD) process, process gases are introduced into a processing chamber through a capacitively coupled showerhead that is disposed over a semiconductor substrate that is circumscribed by a process kit. Once a plasma is formed in a PECVD chamber, the plasma and process gas(es) interact with the substrate to deposit a desired material layer thereon.

Conventional plasma processing chamber designs in which the generated plasma is disposed over the substrate surface can cause unwanted sputtering and damage to the substrate surface due to the interaction of electrons and ions formed in the plasma with the substrate surface. Floating and electrically grounded components that are exposed to the generated plasma will generally accumulate a net charge. The formed net charge causes electrons and/or ions formed in the plasma to bombard and possibly damage the exposed surfaces of the substrate or chamber component. Thus, in some applications it is desirable to form gas radicals that have sufficient energy to easily react with the substrate surface, or surface of the chamber component, to enhance the reaction rate, while not energetically bombarding the surface of the substrate or chamber component, since the non-ionized gas radical is not affected by charge formed on the substrate or component surface.

Therefore, to prevent or minimize the plasma interaction with the substrate and chamber components, remote plasma source (RPS) designs have been developed. Typical remote plasma source designs include a plasma generation region that is remotely positioned from the processing region of the processing chamber in which a substrate is positioned. In this way the plasma generated in the plasma generation region of the RPS device will generally not interact with the substrate surface.

However, conventional RPS designs typically utilize microwave, capacitively coupled, or inductively coupled energy sources that have a narrow plasma generating region, which will cause these devices to have a smaller than desirable plasma processing window that limits the range of energies of the formed gas radicals and gas ion that are formed in the plasma generating region of the conventional RPS device. Conventional RPS designs traditionally use a closed loop RF source configuration having windings that are wrapped around a closed magnetically permeable core that surrounds a portion of the plasma generating region. In one example shown in FIG. 1, which corresponds to FIG. 3 of the issued U.S. Pat. No. 6,150,628, a conventional RPS design will generally include regions 112, 114 of a metallic plasma chamber 100 in which a plasma is generated by the delivery of energy to a first and a second core 104, 106. The generated fields, which are focused by the position and shape of the cores 104, 106 relative to the regions of high activity "PR," have a relatively small area and have a very limited time in which to transfer the RF energy to a gas flowing through the conventional RPS device. Thus, conventional RPS designs with a small plasma generating region have a very limited ability to generate and/or control the energies of the formed gas radicals and/or gas ions.

To resolve the energy coupling efficiency problems, typically, conventional RPS devices may require both electro-negative type gases (e.g., ammonia ($NH_3$)) and electro-positive type gases (e.g., argon (Ar)) to flow at the same time through the plasma generation region to more easily form and sustain a generated plasma therein. However, this requirement may limit the ability of the RPS device to perform different process applications, as in some cases it is desirable to only deliver a single electro-negative or a single electro-positive gas to improve the processing speed or plasma processing results. Also, it is often desirable to form and sustain a plasma within regimes that have a low plasma impedance, such as where the pressure in the plasma generation region is low (e.g., <200 mTorr). Conventional RPS designs that inefficiently couple the plasma energy to the processing gasses are not currently able to meet the needs of the semiconductor processing industry. Therefore, there is a need for an RPS design that more effectively couples the delivered RF energy to the processing gases, has a wider process window and is able to work in a wider range of plasma impedances.

Conventional RPS designs are generally not able to tune power delivered to the plasma without also altering other process conditions. For example, a conventional RPS design may increase power delivery by mechanically inhibiting gas flow of the plasma generating region, so that the gas atoms have a longer dwell time in the generated electric fields. However, this slowed flow will also increase pressure in the plasma generating region, which may cause deleterious or at least sub-optimal effects on the plasma and/or the processing. This interrelation seen in conventional RPS designs makes it particularly difficult for a conventional plasma source to support multiple process applications and cleans.

Additionally, there is a need in the art for an apparatus and process that more effectively generates and controls plasma uniformity and has a larger processing window, without significantly increasing processing or hardware costs.

SUMMARY

Embodiments disclosed herein include a remote plasma source comprising a core element and a first plasma block including one or more surfaces at least partially enclosing an annular-shaped plasma generating region that is disposed around a first portion of the core element. The remote plasma source further comprises one or more coils disposed around respective second portions of the core element, and a radio frequency (RF) power source configured to drive a RF power signal onto the one or more coils that is based on a determined impedance of the plasma generating region. Energy from the RF power signal is coupled with the plasma generation region via the one or more coils and the core element.

Embodiments disclosed herein also include a method of controlling plasma generation using a remote plasma source. The remote plasma source comprises a core element and an annular-shaped plasma generating region disposed around a first portion of the core element. The method comprises delivering a radio frequency (RF) power signal having a first frequency to one or more coils disposed around a second portion of the core element, and upon determining a change of impedance of the plasma generating region, changing the frequency of the delivered RF power signal from the first frequency to a second frequency.

Embodiments disclosed herein also include a method of forming energetic gas atoms. The method comprises flowing a process gas into an annular-shaped plasma generating region that is at least partially enclosed by one or more surfaces of a first plasma block, wherein the plasma generating region is disposed around a first portion of a core element. The method further comprises delivering a first radio frequency (RF) power signal to a coil disposed around a second portion of the core element, wherein the RF power signal has a first frequency selected to match a first resonance frequency based on impedances of the coil and the plasma generating region. Energy from the RF power signal is coupled with the plasma generating region via the coil and the core element. The method further comprises increasing an amplitude of the delivered RF power signal to form a plasma within the plasma generating region, and adjusting the frequency of the delivered RF power signal to a second frequency selected to match a second resonance frequency reflecting a changed impedance of the plasma generating region caused by the formed plasma.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the present disclosure generally provide a plasma source that includes an RF power source coupled to one or more coils and which, during operation, adjusts at least a frequency of a power signal delivered to the one or more coils based on an impedance of the plasma generating region. The methods and plasma source configurations disclosed herein can be used to generate and easily control the ignition and creation of a sustained plasma in the processing region of a process chamber. Embodiments of the disclosure may also provide a plasma source that is able to provide a uniform plasma and create a larger processing window, without significantly increasing processing or hardware costs. Embodiments of the present disclosure may further provide a plasma source that is coupled to a process chamber and that includes a core element having a first end, a second end, and a core element central axis. The plasma source may also further include a first plasma block having one or more surfaces at least partially enclosing a first annular-shaped plasma generating region that is disposed around a first portion of the core element, as well as one or more coils disposed around respective second portions of the core element.

Section 1—Hardware Configuration Examples

Figure 2A:
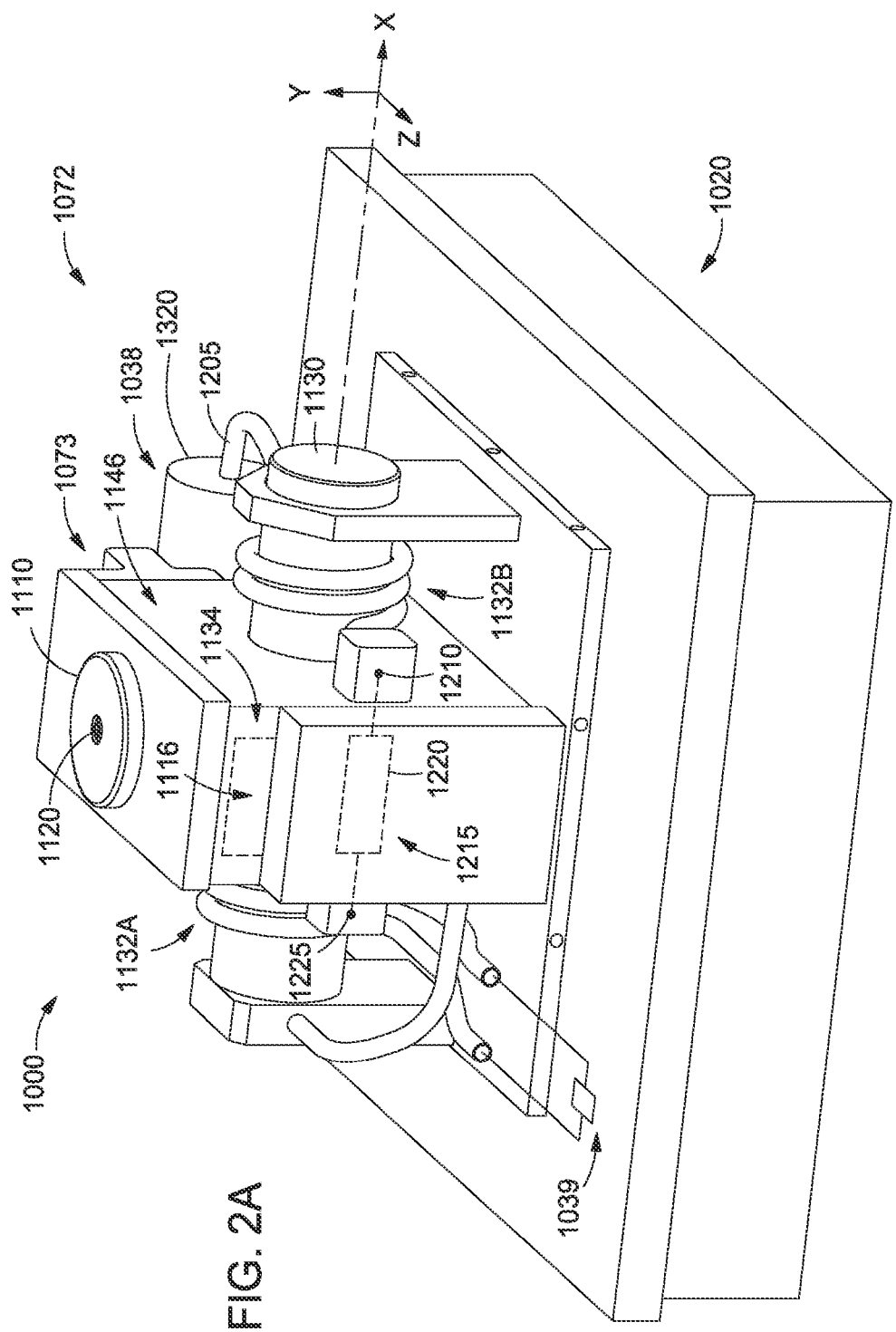
FIG. 2A is an isometric view of a plasma source coupled to a process chamber, according to embodiments disclosed herein.

FIG. 2A is an isometric view of a plasma source 1000, according to one embodiment. The plasma source 1000 is coupled to a process chamber 1020 so that gas radicals and/or gas ions formed in a plasma generating region 1118 (see FIG. 2B) of a plasma controlling device 1072 found in the plasma source 1000 can be delivered to a processing region 1128 (see FIG. 2B) of a process chamber 1020. The gas radicals and/or gas ions formed in the plasma generating region 1118 are then used to enhance the deposition, etching, and/or cleaning process(es) performed on the process chamber components and/or substrates disposed therein.

Figure 2B:
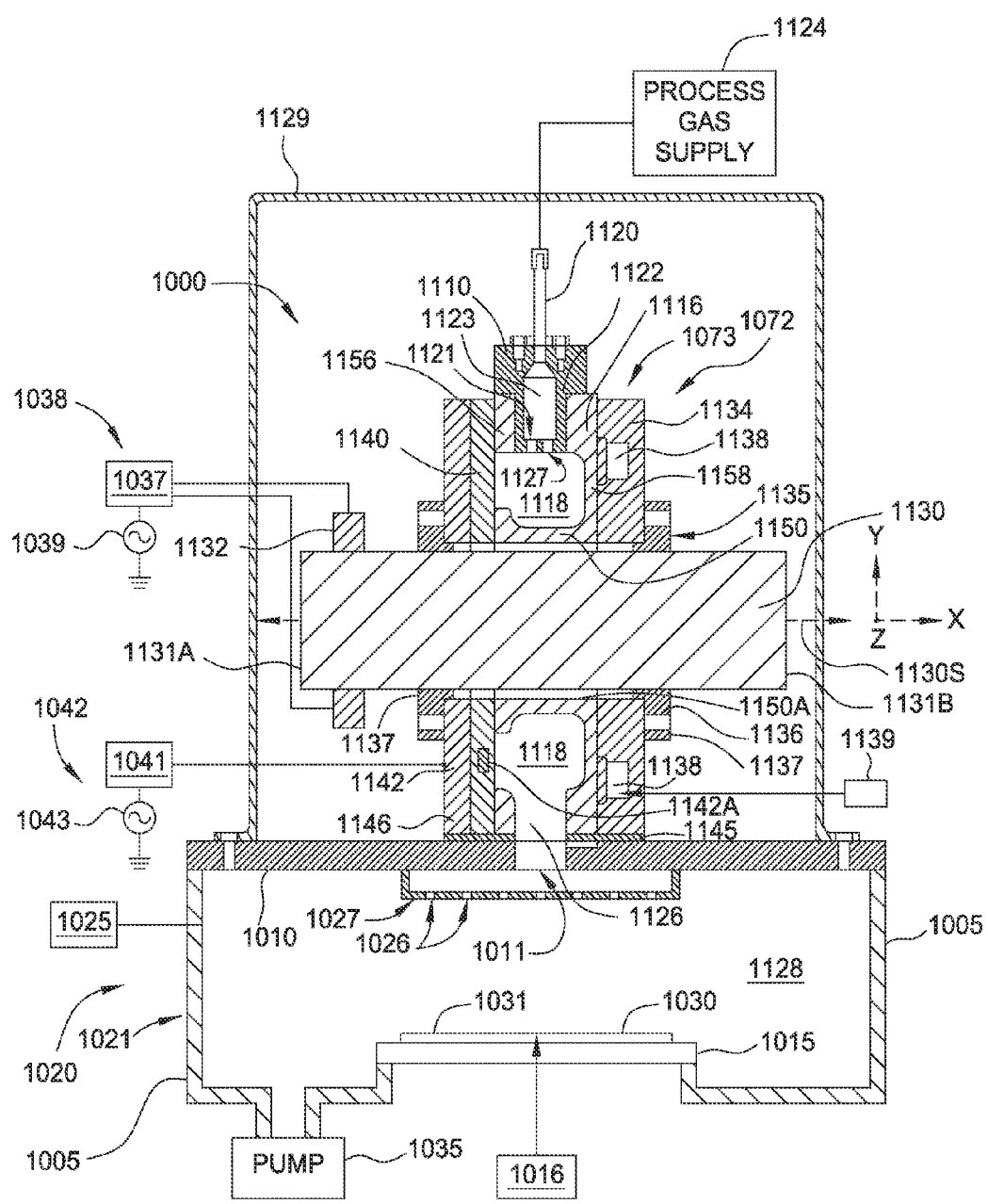
FIG. 2B is a cross-sectional view of the plasma source illustrated in FIG. 2A, according to embodiments disclosed herein.

FIG. 2B is a cross-sectional view of the plasma source 1000 of FIG. 2A, which is formed by cutting the plasma source 1000 along an X-Y plane (see FIG. 2A) that passes through the central axis 1130S of the core element 1130. In this configuration, the plasma source 1000 comprises a plasma controlling device 1072 and the process chamber 1020 that are useful for practicing one or more of the embodiments described herein. In some plasma source configurations, due to the configuration and/or positioning of the plasma generating region 1118 relative to a substrate or chamber component disposed in the processing region 1128 of the process chamber 1020, the amount of charged species (e.g., ions, electrons) diffusing out of the plasma generating region 1118 (e.g., reference "A" in FIGS. 2C and 2D) will preferably only minimally reach and interact with a substrate or chamber component during processing. The diffusion or flux of the gas radicals and/or gas ions from the plasma generating region 1118 to the processing region 1128 can also be controlled by adjusting the processing pressure and/or flow of the gas atoms through the plasma generating region 1118 from the gas supply 1124. However, in some cases, the plasma source 1000 is configured so that a small amount of charged species interaction with the surface of a substrate disposed in the processing region 1128 of the process chamber 1020 occurs to further promote an etching or CVD-type deposition process.

As illustrated in FIG. 2B, the process chamber 1020 can include a chamber body 1021 that has one or more walls that sealably enclose the processing region 1128, such as chamber sidewalls 1005 and a chamber lid 1010. In some configurations, a substrate pedestal 1015, which is used to support a substrate 1030, is disposed adjacent to an inlet 1011 formed in the chamber lid 1010. In general, the inlet 1011 is in fluid communication with the plasma generating region 1118 of the plasma source 1000. In some embodiments, a showerhead assembly 1027 is disposed between the inlet 1011 and the substrate pedestal 1015 to provide a uniform distribution of gas radicals and/or gas ions formed in the plasma generating region 1118 to be delivered through holes 1026 formed in the showerhead assembly 1027 to a surface 1031 of the substrate 1030. The showerhead assembly 1027 may be electrically grounded or floating, and the size and density of the holes 1026 may be selected to adjust the amount and uniformity of the gas radicals and/or gas ions entering the processing region 1128. A backside gas supply 1016 may also be provided to furnish a gas such as argon or helium to a gap (not shown) formed between the backside of the substrate 1030 and the substrate pedestal 1015 to improve thermal conduction between the temperature controlled substrate pedestal 1015 and the substrate 1030. A process gas supply 1025 can be used to furnish a process gas into the processing region 1128. A vacuum pump system 1035 comprising a turbo pump, rough pump, and/or other similar device controls the pressure within the process chamber 1020 and/or plasma source 1000. In one example, the pressure within the processing region 1128 and/or plasma generating region 1118 during processing is maintained at a vacuum pressure, such as between about 0.5 milliTorr (mT) and about 1 Torr. In some embodiments, a shield 1129 is directly or indirectly mounted on the chamber lid 1010 to house the plasma controlling device 1072. The top of the shield 1129 is provided with an opening (not shown) that corresponds to the location of the gas inlet 1120. The shield 1129 is designed to reduce the effects of the fields produced by the plasma controlling device 1072 and is preferably made of high magnetic permeability (or high-µ) material, such that all the generated fields are contained in the internal region of the shield 1129.

In some embodiments, the plasma controlling device 1072 is attached or mounted on the chamber lid 1010 of the process chamber 1020, and is configured to produce and to introduce a gas radicals and/or ionized gas atoms into the processing region 1128 of the process chamber 1020. The plasma controlling device 1072 may be spaced apart and electrically isolated from the components in the process chamber 1020 by an isolation plate 1145, which is made from a dielectric material (e.g., ceramic material). The plasma controlling device 1072 generally contains a magnetic core, or hereafter core element 1130, a source assembly 1038 coupled to the core element 1130 and a processing region assembly 1073. The plasma generating region 1118, which is generally symmetrically distributed around the core element 1130, may be enclosed by one or more components found in the processing region assembly 1073. In one embodiment, the processing region assembly 1073 comprises a dome portion 1110, a plasma block 1116, a cooling plate 1134, and a side cover 1140, that enclose the plasma generating region 1118.

During operation of the plasma source 1000, a substrate 1030 is placed on the substrate pedestal 1015 in the process chamber 1020 for processing. The plasma generating region 1118 of the plasma source 1000 may then be pulled to a predetermined pressure/vacuum by the vacuum pump system 1035. Once the predetermined pressure is achieved, a deposition, etching or cleaning gas(es) may be introduced into the plasma controlling device 1072 via the gas inlet 1120 and flow through the plasma generating region 1118 from the gas diffuser body 1122, while the vacuum pump system 1035 continues to pump the plasma source 1000, such that an equilibrium processing pressure is obtained. The processing pressure is adjustable through, for example, throttling the communication of the vacuum system to the plasma source 1000 or adjusting the flow rate of the process or clean gases being introduced into plasma source 1000 through the gas inlet 1120. Once the pressure and gas flows are established, a power source is activated. An RF power source, such as the source assembly 1038, is electrically connected to a coil 1132. The fields generated by the coil 1132 inductively forms a magnetic field in the core element 1130 that inductively couples the delivered energy to a gas disposed in the plasma generating region 1118 to excite the gas into a plasma state. In one embodiment, the ion density and radical concentration in the formed plasma may be increased or decreased through adjustment of the power supplied to the coil 1132 or through adjustment of the processing pressure in plasma source 1000. In some embodiments, and as seen in FIG. 2A, multiple coils 1132A, 1132B may be disposed around a core element 1130. In one configuration, the source assembly 1038 is electrically connected to one of the coils 1132B through a connection 1205. The coil 1132B includes another electrical connection 1210 at an opposite end from the connection 1205. Connection 1210 is electrically connected to coil 1132A using a similar connection 1225. The connections 1205, 1225 may be connected directly (i.e., shunted together) or may include one or more electrical elements 1220 disposed therebetween. Though not shown, coil 1132A may also be coupled to the RF power source 1039 of the source assembly 1038 through a transformer 1320 at an opposite end from connection 1225. The electrical elements 1220 may generally be selected to improve the efficiency of the plasma source 1000. In one embodiment, electrical elements 1220 may include circuit tuning elements and sensor devices for controlling power delivery to the plasma generating region 1118. The electrical elements 1220 may be disposed proximate to wall 1215, such as within the wall or attached to the wall.

As shown, the plasma block 1116 comprises a component that has at least a portion of an annular-shaped plasma generating region 1118 formed therein. The annular-shaped plasma generating region 1118 is generally formed around the core element 1130. In one embodiment, as illustrated in FIG. 2B, the annular-shaped plasma generating region 1118 has a rectangular shaped cross-section. However, the shape of the cross-section of plasma generating region 1118 could be any desirable shape, such as circular, elliptical, or any other useful shape, and thus the rectangular shaped plasma generating region is not intended to be limiting as to the scope of the disclosure. In one configuration, the plasma generating region 1118 is at least partially enclosed by an inner wall 1150, an outer wall 1156, and a side wall 1158 formed in the plasma block 1116. In one embodiment, the plasma generating region 1118 is fully enclosed by the walls 1150, 1156, 1158 of the plasma block 1116 and the side cover 1140 that is attached to the plasma block 1116 using conventional fasteners (not shown). In one configuration, an annular-shaped plasma generating region 1118 comprises a volume that is formed about a central axis of the plasma block 1116. In one configuration, the volume of the annular-shaped plasma generating region 1118, neglecting the added volume of the outlet port 1126 and inlet port 1127 regions, generally is equal to the area of the cross-section of plasma generating region (e.g., rectangular section) revolved about the central axis. In some embodiments, the annular-shaped plasma generating region 1118 may be completely or substantially symmetric about the central axis of the plasma block 1116.

The core element 1130 is generally disposed through a portion of the plasma block 1116 near an adjacent inner surface 1150A of the inner wall 1150 of the plasma block 1116. In one aspect, the core element 1130 comprises a high magnetic permeability (high-μ) rod or tube, for example, a ferrite rod, but could be other magnetic material depending on the coupling structure. The magnetic material from which the core element 1130 is formed will generally have the following characteristics: 1) a low core loss density at high impressed frequencies, 2) have a high Curie temperature, and 3) have a high bulk resistivity. In general, the core element 1130 can be formed from any material that can be used to provide a path through which the generated fields (e.g., magnetic fields) created by the flow of RF current through one or more coils (e.g., coil 1132) found in the source assembly 1038, will preferentially flow. In one embodiment, the core element 1130 comprises a ferrite-containing element. While the term "ferrite element" and "ferrite material" are used herein, these terms are not intended to be limiting as to scope of the disclosure. Also, in one embodiment, the core element 1130 comprises a bundle of smaller diameter cylinders or rods that are aligned about a center axis, such as the central axis 1130S which is coincident with the X-axis shown in FIG. 2B.

Figure 2C:
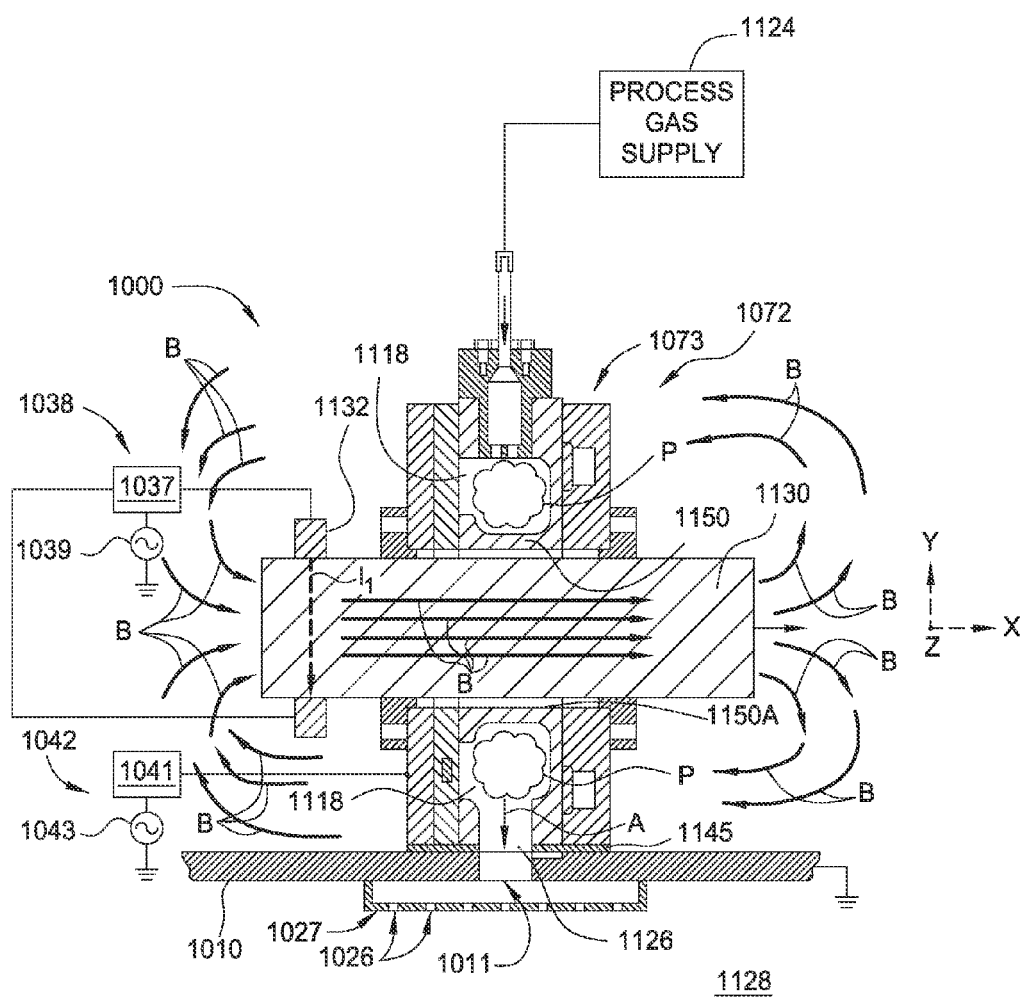
FIG. 2C is a cross-sectional view of the plasma block illustrated in FIG. 2A, according to embodiments disclosed herein.

FIG. 2C is a close-up cross-sectional view of the plasma controlling device 1072 during operation, according to one embodiment. As shown, an inductively coupled plasma "P" is formed in the plasma generating region 1118 by delivering energy from a source assembly 1038 into coil 1132, which induces a magnetic field (i.e., item "B" in FIG. 2C) in the core element 1130. The induced magnetic field B thus delivers energy to the plasma generating region 1118 that excites the gas atoms disposed therein into an excited state to form a plasma that will contain gas radicals and/or ions. During plasma processing, a processing gas is delivered into the plasma generating region 1118 through an inlet port 1127 formed in the outer wall 1156 of the plasma block 1116 and the excited gas atoms exit the plasma generating region 1118 through an outlet port 1126 that is also formed in the outer wall 1156 of the plasma block 1116. The outlet port 1126 thus fluidly couples the plasma generating region 1118 to the processing region 1128 of the process chamber 1020. Therefore, the chemistry of the gas delivered to the processing region 1128 of the process chamber 1020 can be controlled by the process gas supply 1124 and the energy of the gas atoms can be controlled by the gas atom residence time in the plasma generating region 1118 (e.g., proportional to flow rate), the delivered RF power, the composition of the gases in the plasma generating region 1118, and the pressure of the plasma generating region 1118.

During plasma processing, an RF current ($I_1$) is delivered through the coil 1132, which is wound around a portion of the core element 1130, that creates a magnetic field (B) that flows through the core element 1130. While not intending to be bound by theory, the magnetic field B passes through the plasma generating region 1118 and causes gas atoms disposed therein to form a plasma "P" due to joule heating. In one embodiment, the power delivered to the coil 1132 may vary between about 0.1 watts (W) to about 10 kilowatts (kW) at an RF frequency of about 400 kilohertz (kHz), while a gas is delivered at a flow rate between about 0.5 standard cubic centimeters per minute (sccm) and about 100 liters per minute (lpm), and while the pressure is maintained at between about 1 millitorr and about 500 torr. It is contemplated that the frequency of the power delivered by the RF power source is not limited to frequencies around 400 kHz and may be run at a desired frequency such as about 10 kHz to greater than 40 megahertz (MHz), depending upon the application. In some cases, it is desirable to deliver the RF power from the RF power source at frequencies less than or equal to about 13.56 MHz.

Figure 1:
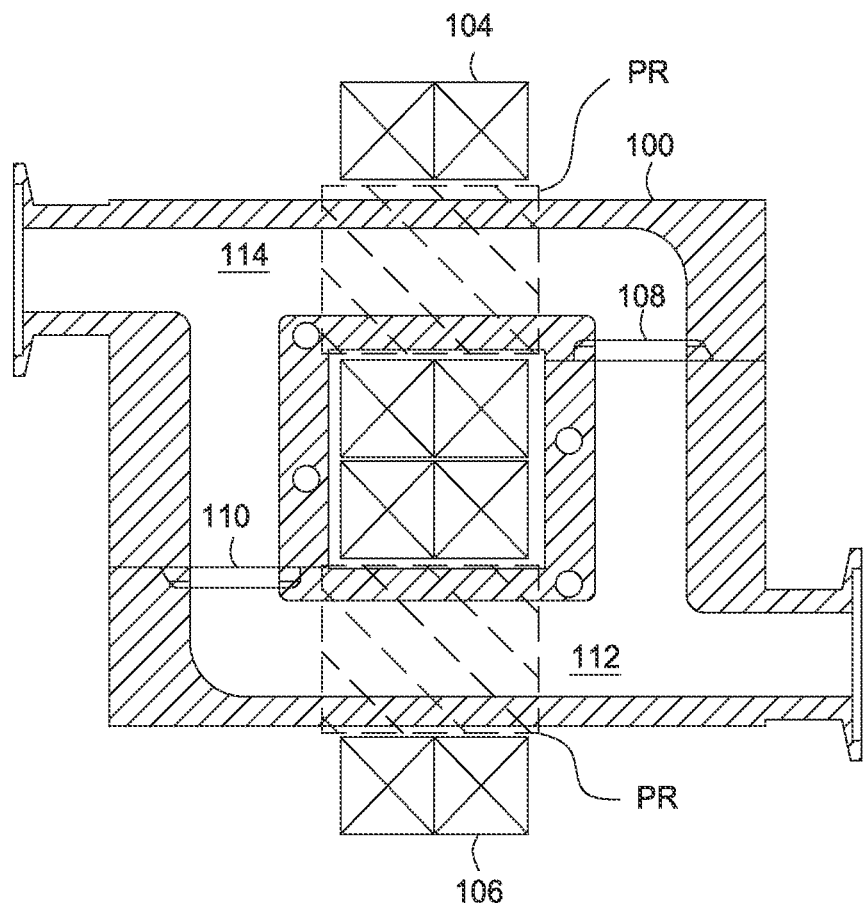
FIG. 1 is a cross-sectional view of a conventional remote plasma source (RPS) device.
Figure 2D:
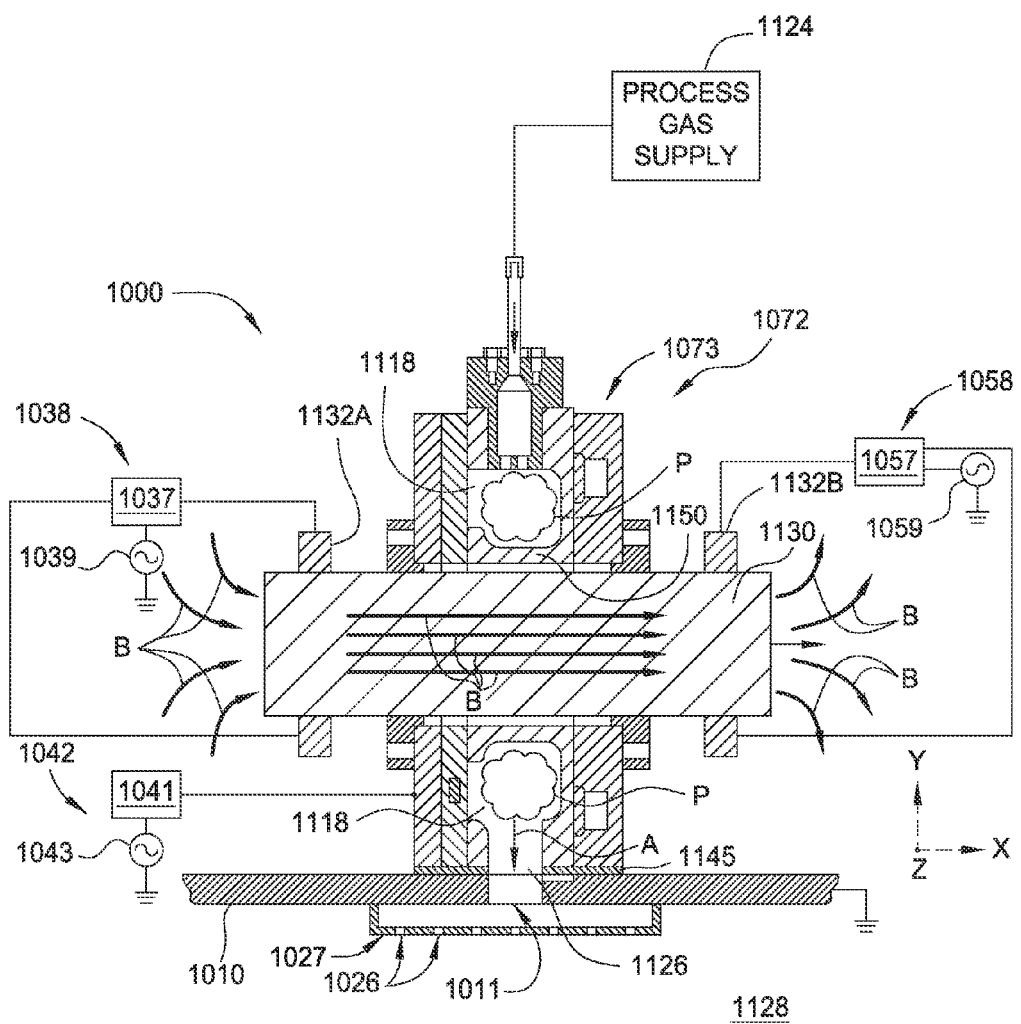
FIG. 2D is a cross-sectional view of a plasma source having two or more coils wound around a core element, according to embodiments disclosed herein.

By use of the plasma source 1000 configuration described herein, it is believed that process window for energetic gas atom creation efficiency and the range of gas radical energies can be greatly improved over conventional plasma generating devices. It is believed that the use of an enclosed plasma generating region 1118 that is symmetrically formed around a magnetically permeable core element (e.g., core element 1130) has a number of advantages over other conventional designs. First, due to the core element 1130 shape and the symmetric orientation of the plasma generating region 1118, a plasma having a uniform density can be formed therein, as schematically illustrated in FIGS. 2C and 2D. The symmetrically formed plasma generating region 1118 is used to improve the coupling efficiency of the delivered RF power by delivering the RF energy over a wider area, and avoiding the efficiency problems created by the common "hot spot" issue found in conventional RPS designs, as discussed above. Second, due to the symmetric shape of the plasma generating region 1118 about the core element 1130 the common problem of having non-uniform field density in different regions of the plasma generating region found in conventional RPS designs, such as a square plasma generating region (FIG. 1) and the localized small plasma coupling region (e.g., "PR" region in FIG. 1) are removed. The non-uniform field density found in conventional RPS designs can have an effect on the radical generation efficiency and the unwanted interaction of the excited gas atoms with portions of the surface of plasma generating region.

In some embodiments, an "open loop" magnetic field, or a magnetic field that is able to evenly distribute all 360 degrees around the center axis of the magnetically permeable core element 1130, is generated due to the coupling of the coil 1132 to the core element 1130. The "open loop" magnetic field will thus improve the uniformity of the plasma density within the plasma generating region 1118. In some embodiments, the magnetically permeable core element 1130 includes an "open loop" design that is generally extended straight through the plasma block 1116, instead of a "closed loop" design as typically seen in the conventional toroidal plasma chamber antenna or RPS designs, where a winding or coil section is wrapped around a closed magnetically permeable core that surrounds a conduit in which the plasma is generated. As discussed above, conventional "closed loop" designs will have higher magnetic field strength only at certain regions around the conduit at which the closed loop core element is positioned.

Core Element

FIGS. 2A-3C generally schematically illustrate a single core element 1130 that is useful for forming a uniform plasma in an enclosed plasma generating region. As noted above, in some embodiments, the core element 1130 need not be a single monolithic element, but may comprise a series of smaller elements that are bundled together to provide a path through which the generated fields (e.g., magnetic fields) will preferentially flow, or may be formed in various different shapes and configurations as will be discussed below.

In one embodiment, as shown in FIGS. 2A-3C, the core element 1130 comprises a bar-shaped element that is disposed through the plasma block 1116. In this configuration, the core element 1130 has a bar shape, or straight length shape, as opposed to a ring, square or other enclosed shape that surrounds the plasma block 1116, as is commonly found in conventional designs. The straight bar shape of the core element significantly improves the ion density in the plasma generating region 1118 (see FIG. 2B), because the inductively generated fields are able to spread out, since they do not have an enclosed core element through which to preferentially flow. Thus, the fields generated from the straight bar-shaped core element are not constrained to a small region of the plasma generating region. The evenly distributed magnetic fields will thus tend to form the plasma density uniform through the symmetrically formed plasma generating region 1118.

In some configurations, the core element 1130 is bar-shaped and has a cross-section that is regular or symmetric about a central axis 1130S, such as a circular or cylindrical cross-section. In one example, the cross-section of the core element 1130 is circular and has a diameter of between about 0.5 inch and about 2 inches and a length of between about 3 inches and about 20 inches. In one example, the ratio (L/d) of the length (L) to the diameter (d) of the core element 1130 is between about 1.5 and about 40, such as between about 2 and about 10. Although the core element 1130 is described here as cylindrical, it is contemplated that the cross-sectional shape of the core element 1130 may be non-circular or non-cylindrical such as square, hexagonal, rectangular, or any other desired shape, either regular or irregular. Core element 1130 may be solidly formed or tubular, and may include one or more features formed therein. In one embodiment, a bar-shaped core element 1130 has two ends 1131A and 1131B (see FIG. 2B) disposed at opposite ends of the core element 1130, such that a straight line coincident with the central axis 1130S of the core element 1130 passes through the two ends 1131A and 1131B.

It has been found that changes to the core element's physical or electrical properties can a have significant impact on the efficiency, stability, and reliability of the plasma source. One skilled in the art will appreciate that both the saturation flux density and the magnetic permeability decrease as the temperature of the core element 1130 increases. Therefore, to overcome the increase in the temperature of the core element 1130 caused by eddy current heating during plasma processing, active cooling of the core element 1130 is generally required.

In some embodiments, during the operation of the plasma source 1000 a temperature-controlled heat exchanging fluid is delivered from a heat exchanger assembly through a portion of the core element 1130 and returned to the heat exchanger assembly. In general, the heat exchanger assembly may be a conventional fluid heat exchanging device, such as a fluid recirculating chiller. The heat exchanging fluid will generally have a high electrical resistivity and good heat transfer characteristics, such as deionized water. In one embodiment, the core element 1130 may include a magnetically permeable core element that is enclosed within a housing. In this configuration, the heat exchanging fluid from the heat exchanger assembly flows within the housing and around and through portions of the core element in order to remove the generated heat formed therein. The magnetically permeable core element may be a ferrite rod or other magnetically permeable material as discussed above. The housing is generally formed from a dielectric material, and may be rigidly formed around the magnetically permeable core element or flexible. Some examples of suitable rigid dielectric materials include alumina ($Al_2O_3$), quartz, aluminum nitride, and composite materials. Some examples of suitable flexible dielectric materials include a plastic material, fiber-impregnated resin material, elastomeric material, and composite materials. In some embodiments, the heat exchanger assembly may provided heat exchange paths for one or more additional components of the plasma source 1000, such as the coil 1132, tuning circuit 1037, RF power source 1039, and so forth.

In some embodiments of the plasma source 1000, which are further discussed below, an actuator 1047 and a system controller 1001 may be used to adjust and tune the position of the core element 1130 relative to the plasma generating region 1118 to improve the RF coupling to the gas disposed therein. In one configuration, a sensor in the power supply delivering energy to the coil 1132, attached to another region of the power delivery circuit, or in communication with the plasma generating region 1118 is used to feed back information to the system controller 1001 about the state of the plasma generated in the plasma generating region 1118, so that the energy coupling to the plasma can be adjusted by the system controller 1001. The information measured by the sensor and returned to the system controller 1001 may include the amount of reflected power, chamber impedance, plasma density, optical emission of the plasma, or other useful information about the state of the plasma formed in the plasma generating region 1118.

Plasma Block

To avoid the material compatibility issues found in conventional toroidal or RPS designs, as discussed above, the plasma block 1116 is preferentially formed from a material that will not react with the gas radicals or ions formed in the plasma generating region 1118 or with the reactive process gases. In general, the plasma block 1116 is formed in a shape that is symmetric about the core element 1130 and comprises a material that will not be appreciably attacked by the plasma chemistry and that has a high thermal conductivity to transfer the heat generated by the plasma to a heat exchanging device. In one embodiment, the plasma block 1116 comprises a high thermal conductivity dielectric material that is formed to a desired symmetric shape. A plasma block 1116 that comprises a solid dielectric material has many advantages over conventional designs, since it avoids the coating defect and possible damage issues commonly found in conventional RPS designs. It is generally difficult to create a fully enclosed plasma processing region by joining two halves that have a coating on the interior surface, since it is hard to assure that surface coatings at the joints between the halves will remain undamaged during the formation process. Use of a solid dielectric material also eliminates the need for insulating blocks (e.g., reference numerals 108, 110 in FIG. 1) that are typically disposed between portions of a conventional metal-containing plasma enclosed region to eliminate the formation of eddy currents in these metal-containing regions. In one embodiment, the plasma block 1116 is made from aluminum oxide ($Al_2O_3$), aluminum nitride (AlN), beryllium oxide (BeO), boron nitride (BN), quartz, or other similar materials. In one example, the plasma block 1116 is made from an aluminum nitride material that is about 2 inches thick (i.e., the X-direction in FIG. 2B). In one embodiment, the inner surface 1150A of the inner wall 1150 may be between about 2 inches and about 5 inches in diameter, the inner surface of the outer wall 1156 may be between about 5 inches and about 10 inches in diameter, and the perimeter of the plasma block 1116 may range from between about 10 inches and about 30 inches, depending upon the application.

Referring back to FIG. 2B, in an effort to further assure that the plasma block 1116 and related components remain cool during processing, a cooling plate 1134 is generally attached to the side wall 1158 of the plasma block. The cooling plate 1134 is thus adapted to remove the heat generated during processing to prevent any seals or connected components from becoming damaged during processing. In one embodiment, the cooling plate 1134 has a substantially circular cooling channel 1138 embedded therein to receive and circulate a cooling medium, such as water that is delivered from the heat exchanging source 1139. In some embodiments, a second cooling plate 1146 having a similar cooling channel may be arranged at the opposing side of the side wall 1158 of the cooling channel 1133, which is attached to the side cover 1140. In one embodiment, the temperature-controlled cooling medium is delivered to the coolant inlets 1143 (FIG. 2A) and returned from the coolant outlets 1144 (see FIG. 2A) formed in the first and second cooling plates 1134, 1146 using a heat exchanging source 1139.

Gas Deliver

As noted above, during plasma processing, a processing gas is delivered into the plasma generating region 1118 from a gas supply 1124 through the inlet port 1127 (FIG. 2B) of the plasma block 1116 and the excited gas atoms exit the plasma generating region 1118 through an outlet port 1126 that is also formed in the plasma block 1116. In one embodiment, a dome portion 1110 of the plasma controlling device 1072 is used to deliver the processing gas(es) to the inlet port 1127 of the plasma block 1116 and plasma generating region 1118 formed therein. In one embodiment, the dome portion 1110 generally includes a gas inlet 1120 and a gas diffuser body 1122. The gas diffuser body 1122 generally extends through the inlet port 1127 in the outer wall 1156 of the plasma block 1116. The gas inlet 1120 is connected to an external gas source(s), for example, a process gas supply 1124, to introduce a process or clean gas(es) into the plasma controlling device 1072. In one embodiment, the dome portion 1110 comprises a gas distribution plenum 1123, which is formed within the gas diffuser body 1122, and used to redistribute and control the gas delivery into the plasma generating region 1118 through holes 1121 formed in gas diffuser body 1122. The outer wall 1156 of the plasma block 1116 is provided with a gas/plasma outlet port 1126, which leads to a processing region 1128 in the plasma source 1000. Therefore, the gas distribution plenum 1123 and the plasma generating region 1118 are in fluid communication.

The process or cleaning gases may include oxygen-containing or nitrogen-containing gases such as $NH_3$, $N_2O$, $NO$, $NO_2$, $O_2$, or fluorine-containing gases such as $F_2$, $NF_3$, $NH_4F$, $CF_4$, $C_3F_8$, $SF_6$, or $C_2F_5H$, and combinations thereof, and optionally, carrier gases, such as argon, helium or nitrogen. In one aspect, the process gas comprises essentially argon (Ar). In another aspect, the process gas comprises essentially ammonia ($NH_3$). In another aspect, an ammonia ($NH_3$) and nitrogen trifluoride ($NF_3$) gases are introduced into the plasma controlling device 1072 to generate the $NH_4F$ plasma, which then may be used to remove native oxides on the substrate placed in the plasma source 1000. It is contemplated that other processing precursor gases, such as TSA, silane, TEOS or other useful precursor gases may be used depending upon the application. The precursor gas may be provided at a flow rate between about 100 sccm and about 1000 sccm. During processing the pressure in the processing region 1128 in the plasma source 1000 may be maintained between about 100 mTorr and about 20 Torr. In one example, the pressure of the chamber is maintained between about 100 mTorr and about 1.25 Torr.

In some embodiments, gas openings or holes 1121 may be formed at one or more angles relative to a central axis of the gas diffuser body 1122, thereby allowing the process or cleaning gas to be delivered into the plasma generating region 1118 in a tangential manner to form a circular type vortex-flow pattern, rather than causing the flowing gas to impinge on the interior surface of the inner wall 1150 after entry into the plasma generating region 1118. In one example, the holes 1121 are formed at an angle relative to a radial direction of the plasma generating region 1118, such as a central axis that bisects the gas diffuser body 1122 and extends through the core element central axis 1130S. In one embodiment, the predetermined angle may be ranging from about 20° to about 70°, such as about 45°. Each opening of the plurality of openings may have a desired width and length, depending upon the application. The gas diffuser body 1122 may contain a desired number of openings, for example, about 10 openings or more, such as about 20 openings or more.

Section 2—Process and Processing Configuration Examples

Plasma Formation and Power Delivery

As discussed above in relation to FIGS. 2B and 2C, the core element 1130 generally provides a path through which the generated fields (e.g., magnetic fields), created by the flow of RF current through one or more coils (e.g., coil 1132) found in the source assembly 1038, will preferentially flow to create a plasma in the plasma generating region 1118. In one configuration, a coil 1132 is wrapped around an outer portion of the core element 1130 to inductively couple the coil to the core element 1130. In one embodiment, the coil 1132 comprises a multiple turns of a conductive material, such as a copper bar, tube, strip or wire that is connected to source assembly 1038. In one example, the coil 1132 comprises between about one and twenty turns of coil, such as between about three and five turns.

The source assembly 1038 may include one or more electrical elements whose properties are preferentially selected to efficiently deliver RF power to the coil 1132 and to plasma generating region 1118. In some configurations, the source assembly 1038 may use frequency tuning elements, impedance matching network tuning, or frequency tuning with forward power serving in order to minimize power reflected to the RF power source 1039 and to more efficiently deliver the RF energy to the coil 1132 and plasma generating region 1118. In one embodiment, the source assembly 1038 comprises a tuning circuit 1037 coupled to an RF power source 1039. The RF power source 1039, which may be external to the plasma controlling device 1072, electrically couples to the coil 1132 through the tuning circuit 1037 and provides RF energy to the coil 1132 and to plasma generating region 1118.

While FIGS. 2B and 2C illustrates only a single inductive coil 1132 positioned outside the toroidal plasma source, this configuration is not intended to limit the scope of the present disclosure, since the number and location of coils 1132 may vary depending upon the application or desirability of plasma ion density. In some embodiments, the coil 1132 may be wound around an outer portion of the core element 1130 at either end, at a center portion of the core element 1130, or evenly wrapped around the core element 1130 from one end to the other. In one embodiment, and as shown in FIG. 2D, where multiple coils are used, each of the coils 1132A, 1132B may be separately connected to a respective RF power source, such as source assemblies 1038 and 1058. As with source assembly 1038, the source assembly 1058 may comprise an RF power source 1059 and/or a tuning circuit 1057. The phase and power level of each of the RF power signals delivered to each of the coils 1132A, 1132B can be adjusted or configured relative to each other to improve the plasma uniformity in the plasma generating region 1118 and/or improve the RF power coupling.

Likewise, although FIGS. 2B-2D illustrate a single plasma source 1000 in relation to a single core element 1130, such a configuration is not intended to limit the scope of the present disclosure. In some processing configurations, a plurality of plasma sources may be arranged in parallel so that process gases that have similar or different compositions can be delivered to each plasma source to provide energetic gas atoms that have varying mixture ratios and/or energies to the processing region 1128 of the process chamber 1020. The multiple plasma controlling devices may be arranged in parallel and may share a common core element that is disposed through the inner walls of each of the respective plasma blocks. The core element in this configuration is generally similar to core element 1130 discussed above, except that it may require some added length to allow it to service both of the plasma controlling devices.

In one configuration, the respective gas inlets of each plasma controlling device may be connected to the same or to different external gas sources to provide different process or cleaning gases to the plasma controlling devices, depending upon the application. A dual (or multiple) plasma controlling device configuration enables fast switching of different plasmas, which may be advantageous in certain applications such as PEALD (Plasma Enhanced ALD) or CVD applications using remote plasma source for deposition or clean regimes. The dual plasma controlling device configuration is also useful to allow simultaneous delivery of energetic gas species from incompatible gases that cannot be desirably excited within a single plasma controlling device.

The plasma formed in the plasma generating region 1118 may have a greater plasma density near the inner wall 1150 versus the outer wall 1156 of the plasma block 1116 due to a gradient in magnetic field strength. Therefore, to further improve the plasma coupling and/or to improve the plasma uniformity within the plasma generating region 1118, various plasma adjusting techniques can be used. For example, field shaping elements such as permanent magnets may be preferentially included in various configurations around the plasma generating region 1118 to shape the plasma uniformity. In another example, one or more coils may be wound around at least part of the plasma block 1116 so that fields generated by flowing a current through the wound coil(s) will redistribute the plasma formed in the plasma generating region 1118.

As discussed above, the source assembly 1038 is generally provided to deliver RF power to the coil 1132 and to plasma generating region 1118. In some embodiments of the plasma source 1000, RF energy may also be provided to other portions of the plasma source 1000 to support generating and sustaining a plasma in the plasma generating region 1118. As shown in FIGS. 2B-2D, a second RF power source assembly 1042 may be further provided to deliver RF power to a portion of the plasma generating region 1118 using an ignition promoting electrode, so that the plasma can be more easily ignited therein. In one embodiment, the second RF power source assembly 1042 comprises an impedance matching element 1041 and an RF power source 1043. The RF power source 1043, which may be external to the plasma controlling device 1072, is electrically coupled to the ignition promoting electrode, such as the first cooling plate 1134 and/or the second cooling plate 1146 (see FIG. 2B), to capacitively couple the energy delivered to the electrode to the gas atoms disposed in the plasma generating region 1118. In one example, as shown in FIG. 2B, the RF power source 1043 is configured to provide an RF bias to the second cooling plate 1146, such as between about 200 volts (V) and about 10 kilovolts (kV), to ignite the plasma in the plasma generating region 1118. The first and second cooling plates 1134, 1146 may be formed from a conductive material (e.g., metal) that is disposed adjacent and parallel to the plasma generating region 1118. At least a portion of the core element 1130 may pass through center of the annular-shaped first and second cooling plates 1134, 1146. In one configuration, the first and second cooling plates 1134, 1146 each have a radial "cut," or "break" (e.g., reference numeral 1146A in FIG. 2A), that inhibits the formation of eddy currents in the annular-shaped element due to the fields generated by the core element 1130 during processing. The isolation plate 1145, which is generally disposed between the plasma controlling device 1072 and the chamber lid 1010, enables the use of ignition promoting electrode(s) that have a large surface area that is RF "hot" for improving the capacitive coupling to the gas disposed in the plasma generating region 1118 during plasma ignition and processing. The isolation plate 1145 prevents the electrodes from being shorted to ground through the grounded components found in the process chamber 1020.

In another configuration, the RF power source 1043 is electrically coupled to an electrode 1142 (see FIG. 2B) that is embedded within the side cover 1140 to capacitively couple the energy delivered to the electrode 1142 to the gas atoms disposed in the plasma generating region 1118. The electrode 1142 may be a conductive annular plate (e.g., metal) that has a surface 1142A that is disposed adjacent and parallel to the plasma generating region 1118. At least a portion of the core element 1130 may pass through center of an annular-shaped electrode 1142. In one configuration, the electrode 1142 is separated and physically isolated from the plasma formed in the plasma generating region 1118 by a dielectric material, and may also contain a radial "cut," or "break", that inhibits the formation of eddy currents in the annular-shaped element due to the fields generated by the core element 1130 during processing.

Adaptive Tuning Configurations and Processes

However, in some embodiments, the source assembly 1038 may be operated to efficiently generate, sustain, and adjust a plasma within the plasma generating region 1118 even without requiring an ignition promoting electrode. Generally, by providing a larger current through the coil(s) 1132, larger amounts of energy may be coupled into the gas(es) in the plasma generating region 1118, allowing a larger process window. Further, by adaptively tuning the RF power signal provided to coil(s) 1132, a more stable amount of power may be delivered to the plasma despite changes in the plasma generating region 1118, such as changes to process variables or even physical variations between different plasma sources 1000.

In one embodiment, the RF power source 1039 may adapt the frequency of the RF power signal to match a resonance frequency of the combination of source assembly 1038, which includes tuning circuit 1037, and coil(s) 1132. Specifically, when the tuning circuit 1037 is disposed in series with the coil(s) 1132, a maximum amount of current may be provided through the formed series circuit at the resonant frequency, as the complex component of the circuit impedance (reactance) is approximately zero.

Figure 3A:
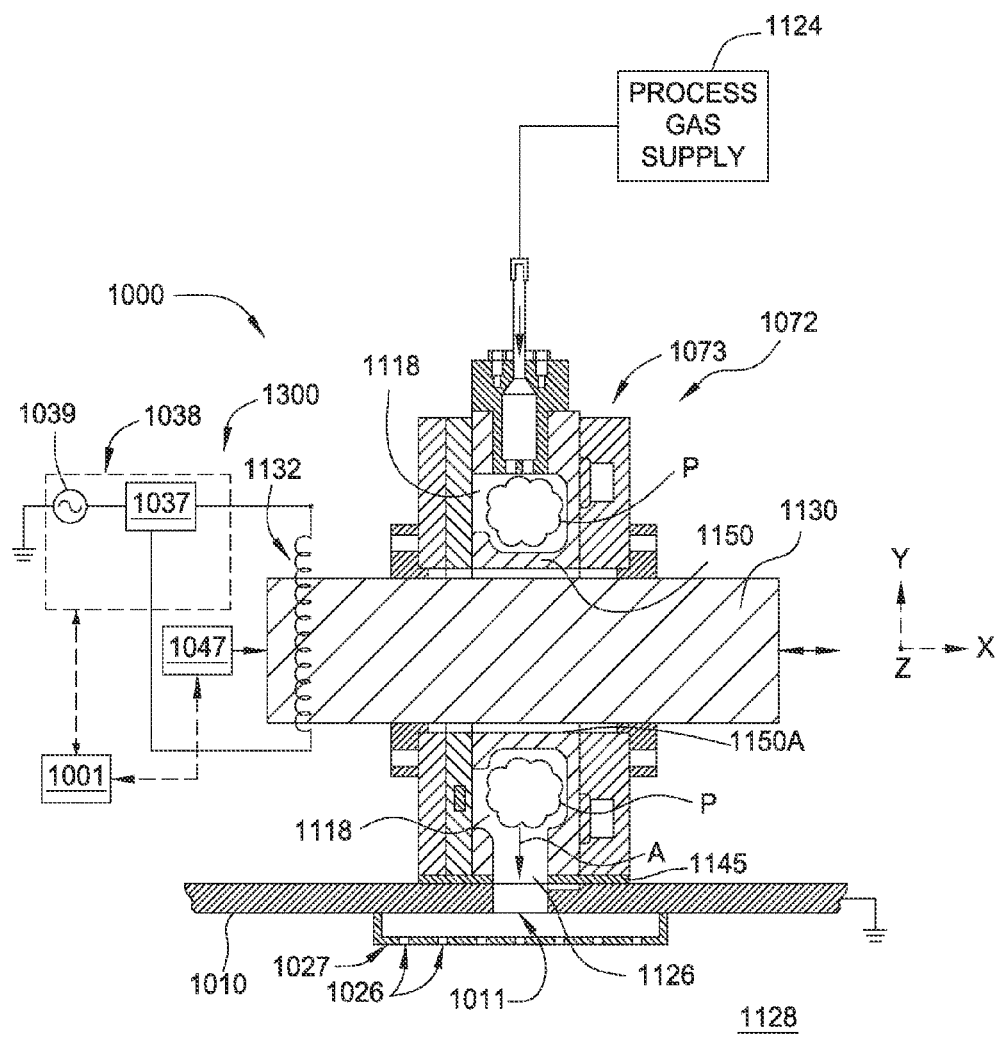
FIG. 3A is a schematic cross-sectional view of a plasma source assembly, according to embodiments disclosed herein.

FIG. 3A is a schematic cross-sectional view of a plasma source assembly, according to embodiments disclosed herein. In FIG. 3A, the source assembly 1038 includes the RF power source 1039 in series with tuning circuit 1037. The source assembly 1038 is then coupled in series to a single coil 1132, forming a series resonant circuit 1300. Though not explicitly shown in FIG. 3A, the electrical properties (e.g., resistance, capacitance, and/or inductance) of the plasma generating region 1118 are also reflected in the series resonant circuit 1300, as the plasma generating region is inductively coupled to the coil 1132 through the core element 1130. Importantly, the coupling of the plasma generating region 1118 to the series resonant circuit 1300 allows the properties of the RF power signal to be dynamically adapted to changes in plasma processes.

The tuning circuit 1037 may include one or more fixed and/or variable electrical elements for providing a desired impedance for the series resonant circuit 1300. For example, as the impedance of the coil 1132 may be predominantly inductive across the range of operating frequencies (i.e., a positive reactance), the tuning circuit 1037 may include one or more capacitive elements that generally provide a negative reactance, and that approximately balance the amount of positive reactance at a desired operating frequency of the circuit. In one example, capacitor(s) included in the tuning circuit 1037 may have fixed and/or adjustable capacitors that have capacitance values between about 0.5 and about 300 nanofarads (nF). Of course, this example does not limit the tuning circuit 1037 from including inductive elements, or combinations of inductive and capacitive elements. Further, the elements of tuning circuit 1037 may be disposed in any desired arrangement (e.g., in series and/or in parallel) to provide the desired impedance for the series resonant circuit 1300.

As will be discussed further below with respect to FIG. 3B, a system controller 1001 provides control signals to the source assembly to select suitable properties of the RF power signal, such as amplitude, frequency, phase, and so forth. In one embodiment, the system controller 1001 is generally adapted to control all of the components contained within the plasma source 1000. The system controller 1001 is generally designed to facilitate the control and automation of the plasma processing techniques described herein and typically may include a central processing unit (CPU) (not shown), memory (not shown), and support circuits (not shown). The CPU may be one of any form of computer processors that are used in industrial settings for controlling various processes and hardware (e.g., motors, power supplies, chamber hardware) and monitor the processes (e.g., substrate temperature, gas flow rate, amount of energy delivered to the core element, position of the core element). The memory (not shown) is connected to the CPU, and may be one or more of a volatile memory such as random access memory (RAM) and/or non-volatile memory such as read only memory (ROM), a hard disk or solid state drive, removable storage, or any other form of digital storage, whether local or remote. Software instructions and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the system controller determines which tasks are performable on a plasma source and substrate.

Further, the system controller 1001 may be used to improve the coupling of the delivered RF energy to the plasma generating region 1118 from source assembly 1038, by driving an actuator (not shown) in a direction (e.g., X-direction) to adjust and tune the position of the core element 1130 relative to the plasma generating region 1118 to improve the RF coupling to the gas disposed therein. By adjusting the position of the core element 1130 relative to the plasma generating region 1118 the electrical characteristics and coupling efficiency can be adjusted. Thus, in one embodiment, during the initial setup of the plasma source 1000, the position of the core element 1130 may be adjusted relative to the plasma generating region 1118 to maximize the power coupling, and the core elements 1130 may be fixed in this position during operation. Alternately, the position of the core element 1130 may be adjusted relative to the plasma generating region 1118 during one or more steps of a substrate processing sequence performed in the process chamber 1020 by use of the actuator 1047 (FIG. 3A) and system controller 1001. In one configuration, the actuator 1047 is a servomotor or stepper motor that is able to adjust, closed-loop control, and/or optimize the position of the core element 1130 in the +X or −X directions by use of sensors coupled to the actuator 1047 (e.g., motor encoders), sensors that are able to detect the variation in the delivered forward and reflected RF power, and the system controller 1001.

Figure 3B:
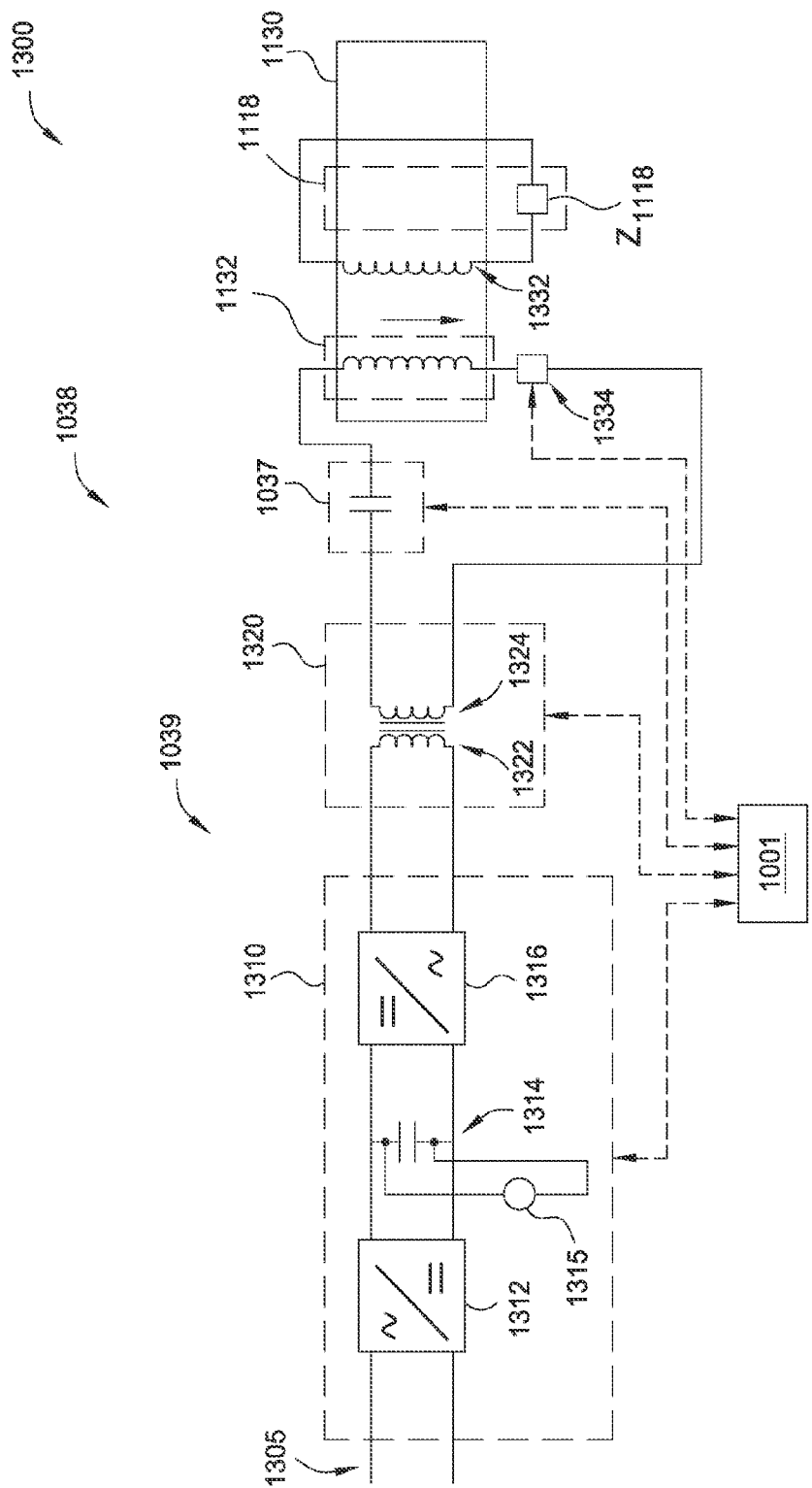
FIG. 3B is a schematic view of the series resonant circuit depicted in FIG. 3A, according to embodiments disclosed herein.

FIG. 3B is a schematic view of the series resonant circuit depicted in FIG. 3A, according to embodiments disclosed herein. The series resonant circuit 1300 includes source assembly 1038, which in turn includes RF power source 1039 and tuning circuit 1037. The series resonant circuit 1300 also includes components from the associated plasma controlling device(s) 1072 (see FIG. 3A) that have relevant electrical properties, such as coil(s) 1132, core element 1130, and plasma generating region 1118.

As shown, RF power source 1039 includes a converter 1310 and (optionally) a transformer 1320, each of which may have various portions controlled by system controller 1001. Of course, other possible configurations of the RF power source 1039 are possible and will be apparent to the person of ordinary skill in the art. Converter 1310 receives an alternating current (AC) input signal at input 1305 and rectifies the AC signal using rectifier 1312. The AC input signal may be one or more phases, such as three phases. The direct current (DC) signal produced by the rectifier 1312 is output onto a DC link 1314, which may include components for conditioning the DC voltage (e.g., smoothing the DC signal), such as a capacitor. The DC signal is provided to inverter 1316, which generates an AC output signal having desired properties.

In some embodiments, and as shown, the AC output signal may be further modulated to a preferred voltage and/or current using transformer 1320 having primary windings 1322 and secondary windings 1324. For example, the transformer may have the numbers of turns of the windings 1322, 1324 selected to provide a greater amount of current (I) through the secondary-side components of the series resonant circuit 1300 (e.g., tuning circuit 1037, coil 1132, impedance $Z_{1118}$). In this case, a step-down transformer arrangement may be used, where the number of primary windings 1322 is greater than the number of secondary windings 1324. The ratios of primary to secondary windings may generally be between 1:1 and 8:1, for example, 2:1, 3:1, 4:1, 5:1, or 7:1. Of course, a step-up transformer may alternately be used.

System controller 1001 may control one or more aspects of the RF power source 1039 in order to produce an RF power signal having the desired properties. For example, system controller 1001 may selectively apply a DC voltage (represented as source 1315) at the DC link 1314 to provide a more stable or otherwise desired voltage to be modulated by the inverter 1316. System controller 1001 may also control the switching frequency of the inverter 1316 to control the frequency of the AC output signal. In cases where the transformer 1320 is variable, the system controller 1001 may control the parameters of the transformer to provide a desired output to the secondary-side components of the series resonant circuit 1300. System controller 1001 may receive feedback signals from one or more sensor devices. As shown, a sensor device 1334 may be disposed in series with coil 1132 and provide measurements of electrical properties of the series resonant circuit 1300, such as a measure of current through the circuit.

As shown, the AC power signal generated by the source assembly 1038 is provided to tuning circuit 1037 and coil 1132. The AC power signal is also provided to impedance $Z_{1118}$ through a mutual inductive coupling between coil 1132 and an inductance 1332 representing inductive properties of the plasma generating region 1118. In an alternate embodiment that includes transformer 1320, the tuning circuit 1037 may be disposed on the primary side of the transformer. Impedance $Z_{1118}$ represents the electrical impedance provided by the plasma generating region 1118, which may vary depending on current process conditions (whether a plasma is formed, the concentration of gases, and so forth). As the plasma generating region 1118 may generally be a toroidal shape disposed around the core element 1130, impedance $Z_{1118}$ may be predominantly inductive (i.e., positive reactance) and may add to the generally inductive impedance provided by coil 1132. As discussed above, the tuning circuit 1037 may include any number of different electrical elements to provide a desired overall impedance for the series resonant circuit 1300, such as one or more capacitors. In cases where the tuning circuit 1037 includes variable elements (e.g., a variable capacitor or inductor), the system controller 1001 may control properties of those variable elements in conjunction with some or all of the other control functions described above.

To maximize the amount of current provided through the series resonant circuit 1300, the RF power source 1039 (or system controller 1001) may select a frequency for the RF power signal that is based on the impedances of the circuit's elements. For example, the impedance of the series resonant circuit 1300 may generally be modeled as:

$$Z_{circuit} = Z_{tuning} + Z_{coil} + mZ_{1118},$$

where $Z_{tuning}$ is the impedance of tuning circuit 1037, $Z_{coil}$ is the impedance of coil 1132, and $Z_{1118}$ is the impedance of the plasma generating region 1118. The value m is a coefficient that generally represents the mutual inductance between coil 1132 and inductance 1332. Using a simple example, and assuming that $Z_{tuning}$ is predominantly capacitive and that $Z_{coil}$ and $Z_{1118}$ are predominantly inductive, the impedance of the series resonant circuit 1300 may be simplified as:

$$Z_{circuit} = -j\frac{1}{\omega C_{tuning}} + j\omega L_{coil} + j\omega m L_{1118},$$

where $\omega = 2\pi * $ frequency.

For the series resonant circuit 1300, the resonant frequency (f) occurs where the circuit impedance (reactance) is zero. Solving for f:

$$f = \frac{1}{2\pi}\sqrt{\frac{1}{C_{tuning}(L_{coil} + mL_{1118})}}.$$

Thus, the RF power source may select the output frequency to operate at or near this point, minimizing impedance and maximizing power delivery to the series resonant circuit 1300. And by receiving feedback from a sensor device 1334, such as a current sensor, the RF power source may dynamically adjust the frequency to determine the resonant frequency of the circuit. Of course, this has been presented only as one simplified example. The impedances of the various components of the series resonant circuit 1300 may vary from the assumptions provided above, and may also include real resistance components that were not discussed here.

During operation of the plasma source, it may be desirable to maintain a constant or stable power level, even though various plasma process conditions may be changed dynamically. Conventionally, RPS designs are not able to tune power delivered to the plasma without also altering other process conditions, since they are configured and/or constrained to control the RF power delivery to a fixed overall circuit impedance. For example, certain RPS designs may require the circuit impedance to remain at a constant value of about 40 or 50 ohms in order to minimize reflected power from a coupled power source. One example of power tuning using a conventional RPS design includes increasing power delivery by mechanically inhibiting gas flow through the plasma generating region, so that the gas atoms have a longer dwell time in the generated electric fields. However, this slowed flow will also increase pressure in the plasma generating region, which may cause deleterious or at least sub-optimal effects on the plasma, generated radical flow into the processing region 1128 (FIG. 2B), and/or the general processing of the substrate. This interrelation between process variables seen in conventional RPS designs makes it particularly difficult for a conventional plasma source to support multiple process applications and cleans.

However, by using frequency tuning of the circuit according to the techniques and embodiments described herein, a plasma source may be suitably adapted to deliver desirable amounts of power across various plasma processing process variable ranges. In other words, the plasma source may better control power delivery over an extended range of process parameters, without causing significant effects to those process parameters. For example, the impedance $Z_{1118}$ may be relatively large prior to forming a plasma in the plasma generating region 1118, and the impedance may drop significantly after the plasma is formed. Before forming the plasma, the RF power source 1039 provides an RF power signal at a first frequency corresponding to the first resonance frequency of the series resonant circuit 1300. After the plasma is generated, the impedance $Z_{1118}$ may decrease significantly, causing the resonance frequency of the series resonant circuit 1300 to also change. The system controller may detect this change in impedance $Z_{1118}$ using a sensor device, for example, by detecting a change in current through the series resonant circuit 1300. The system controller 1001 may then control RF power source 1039 to responsively alter the RF power signal to have a second frequency, or adjusted frequency, based on the new resonance frequency of the circuit.

Generally, by allowing the frequency of the RF power signal to track the resonant frequency, the amount of current (I) and power delivered to the components of the series resonant circuit may remain more or less constant despite any changes occurring within the plasma generating region, such as forming or extinguishing a plasma or changing plasma process conditions (e.g., chamber pressure, gas flow rates, etc.). Further, finding and tracking the resonant frequency may also help to compensate for any variances occurring between different plasma sources, which may be caused, for example, by variances in component materials or manufacturing processes. And of course, the system controller 1001 may also dynamically adjust other properties of the RF power signal, such as the amplitude of the power signal, at the DC link or at various other control points within the RF power source 1039 and/or the series resonant circuit 1300 to provide desired amounts of electrical energy (which may be specified as power, current, voltage, etc.) to support one or multiple process applications or cleans.

Figure 3C:
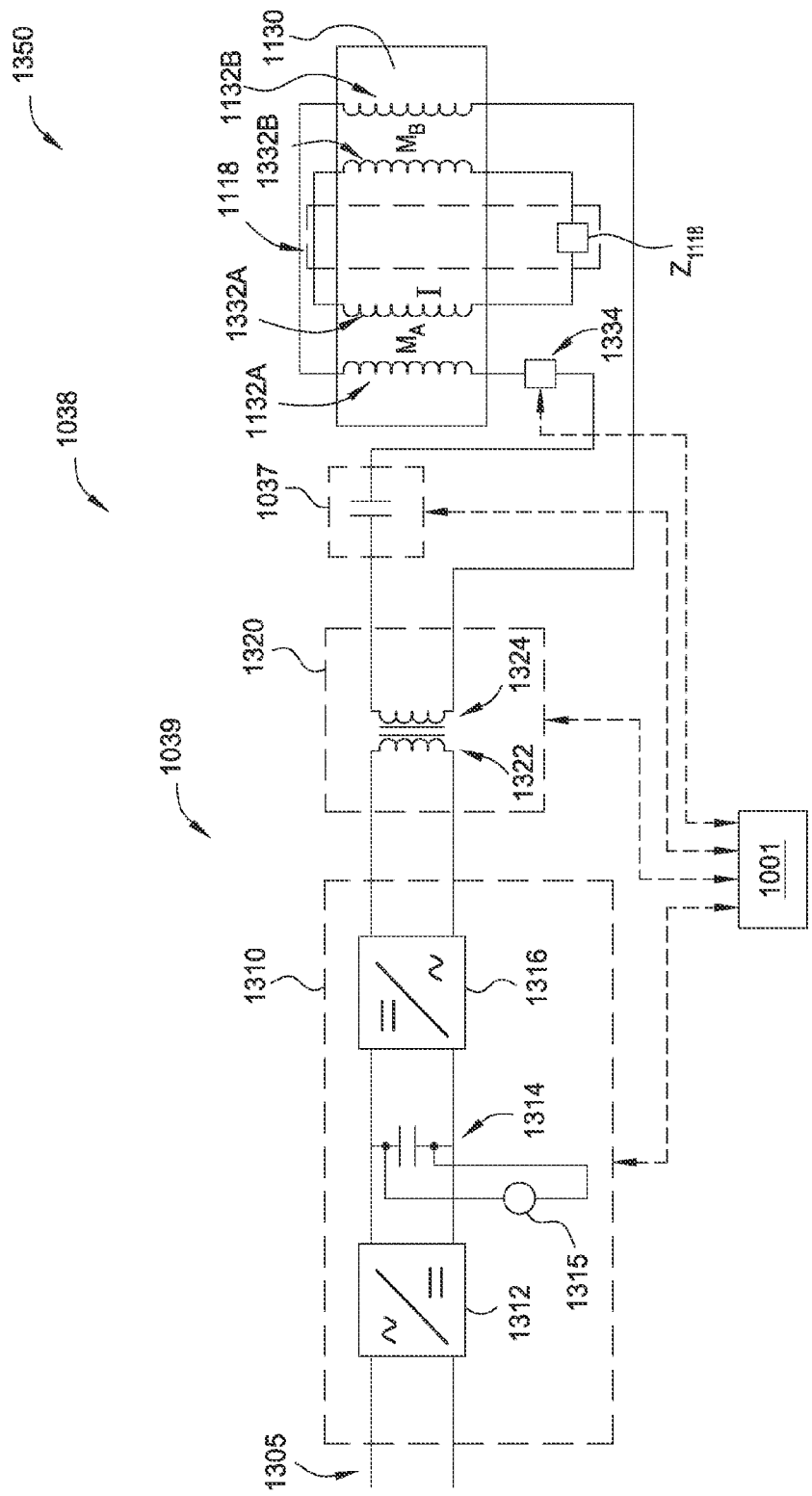
FIG. 3C is a schematic view of the series resonant circuit for a plasma source assembly having two or more coils wound around a core element, according to embodiments disclosed herein.

FIG. 3C is a schematic view of a series resonant circuit for a plasma source assembly having two or more coils wound around a core element, according to embodiments disclosed herein. As shown, the plasma source assembly includes two coils 1132A, 1132B disposed around a common core element 1130. The phase and power level of the RF power signals delivered to the coils 1132A, 1132B may generally be adjusted or configured to improve the plasma uniformity in the plasma generating region 1118 and/or improve the RF power coupling to the plasma generating region 1118 during processing.

The series resonant circuit 1350 includes source assembly 1038, which in turn includes RF power source 1039 and tuning circuit 1037. The series resonant circuit 1350 also includes components from the associated plasma controlling device(s) 1072 (see FIG. 3A) that have relevant electrical properties, such as coils 1132A, 1132B, core element 1130, and plasma generating region 1118.

As with FIG. 3B, RF power source 1039 includes a converter 1310 and optionally a transformer 1320, each of which may have various portions controlled by system controller 1001. The AC power signal generated by the source assembly 1038 is provided to tuning circuit 1037 and coils 1132A and 1132B. The AC power signal is also provided to impedance $Z_{1118}$ through mutual inductive couplings between coil 1132A and inductance 1332A, and between coil 1132B and inductance 1332B. Inductances 1332A, 1332B represent inductive properties of the generally annular-shaped plasma generating region 1118. In one embodiment, the tuning circuit 1037 may be disposed between coils 1132A and 1132B. In an alternate embodiment that includes transformer 1320, the tuning circuit 1037 may be disposed on the primary side of the transformer.

To maximize the amount of current provided through the series resonant circuit 1350, the RF power source 1039 (or system controller 1001) may select a frequency for the RF power signal that is based on the impedances of the circuit's elements. For example, the impedance of the series resonant circuit 1350 may generally be represented as:

$$Z_{circuit} = Z_{tuning} + Z_{1132A} + Z_{1132B} + (m_A + m_B)Z_{1118},$$

where $Z_{tuning}$ is the impedance of tuning circuit 1037, $Z_{1132A}$ is the impedance of coil 1132A, $Z_{1132B}$ is the impedance of coil 1132B, and $Z_{1118}$ is the impedance of the plasma generating region 1118. The values $m_A$ and $m_B$ are coefficients that generally represents the mutual inductance between coil 1132A and inductance 1332A, and between coil 1132B and inductance 1332B, respectively. Using a simple example, and assuming that $Z_{tuning}$ is predominantly capacitive and that $Z_{1132A}$, $Z_{1132B}$, and $Z_{1118}$ are predominantly inductive, the impedance of the series resonant circuit 1350 may be modeled as:

$$Z_{circuit} = -j\frac{1}{\omega C_{tuning}} + j\omega L_{1132A} + j\omega L_{1132B} + j\omega(m_A + m_B)L_{1118},$$

where $\omega = 2\pi*$frequency.

Again, resonant frequency (f) for the series resonant circuit 1350 occurs where the circuit impedance (reactance) is zero. Solving for f:

$$f = \frac{1}{2\pi}\sqrt{\frac{1}{C_{tuning}(L_{1132A} + L_{1132B} + (m_A + m_B)L_{1118})}}.$$

Thus, the RF power source may select the output frequency to operate at or near this point, minimizing impedance and maximizing power delivery to the series resonant circuit 1350. And by receiving feedback from a sensor device 1334, such as a current sensor, the RF power source may dynamically adjust the frequency to determine the resonant frequency of the circuit. Of course, this has been presented only as one simplified example, and the impedances of the various components of the series resonant circuit 1350 may vary.

Figure 4:
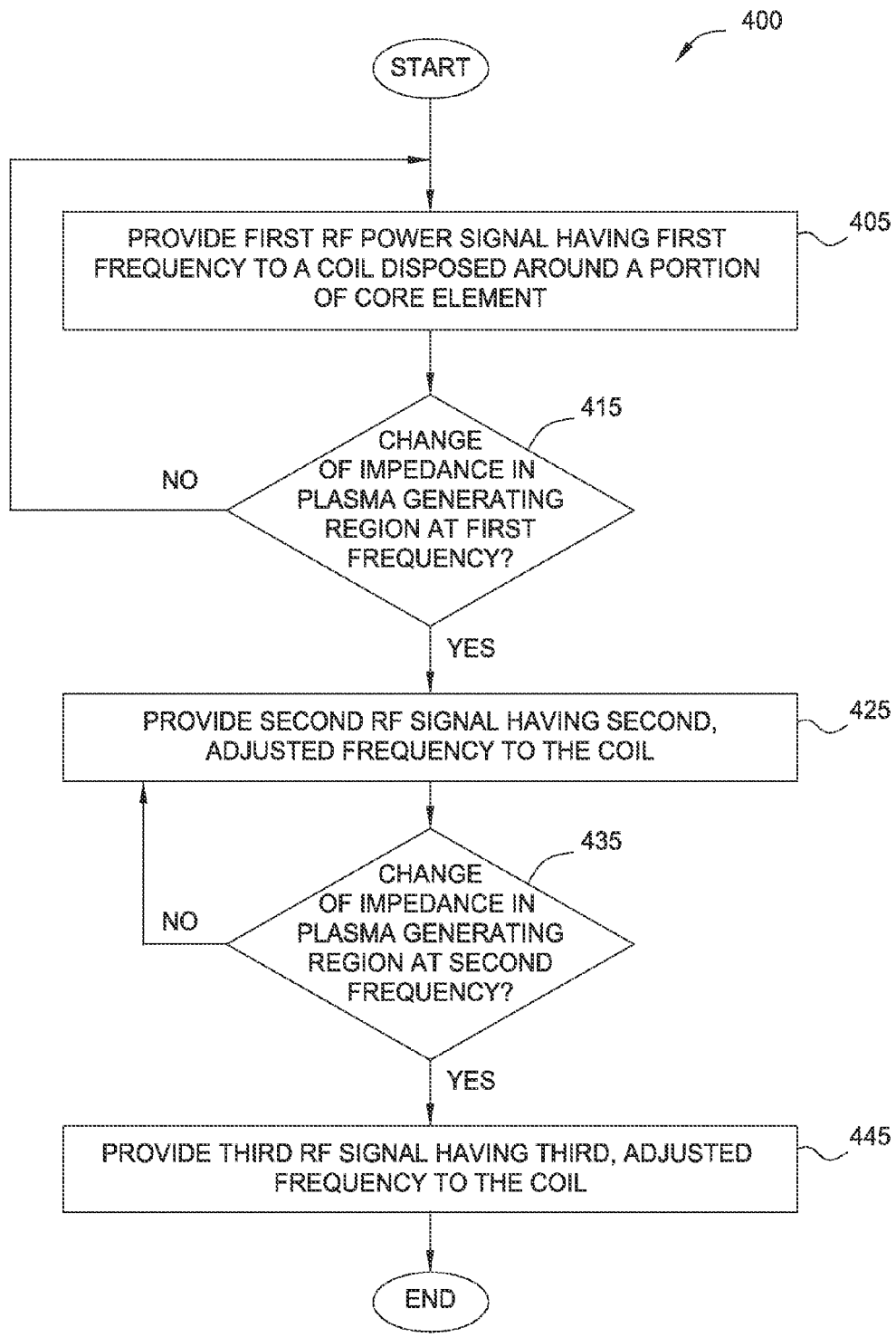
FIG. 4 illustrates a method of controlling plasma generation of a plasma source, according to embodiments disclosed herein.

FIG. 4 illustrates a method of controlling plasma generation of a plasma source, according to embodiments disclosed herein. Method 400 may generally be used with any of the plasma sources described herein, and may also be applied to other remote plasma source designs with beneficial effects.

Method 400 begins at block 405, where a first RF power signal having a first frequency is provided to a coil disposed around a portion of a core element. The RF power signal may be used to energize gas atoms in a plasma generating region disposed around the core element, such as an annular-shaped region. Generally, the first frequency may be selected by a system controller, which controls output from an RF power source. While the first frequency may be any frequency, in some embodiments the first frequency may be selected at or near a resonance frequency for a series resonant circuit that includes the coil, the plasma generating region of the plasma source, and/or a tuning circuit. The resonance frequency for the circuit reflects the impedances of these components.

At block 415, the system controller determines whether a change in impedance has occurred in the plasma generating region. Generally, the change in impedance may be caused by forming or extinguishing a plasma in the plasma generating region, or by modifying one or more plasma process variables, such as temperature, pressure, concentration of gas(es), flow rate, and so forth. The system controller may be able to detect a change in impedance using various sensor measurements such as power, voltage, current, reflected power, and so forth. If no change in impedance has occurred, the method may return to block 405 and continue to provide the RF power signal with the first frequency. However, if a change in impedance is detected, the method proceeds to block 425.

At block 425, a second RF power signal having a second frequency, or adjusted frequency, is provided to the series resonant circuit. The system controller may select the second frequency for the RF power signal based on an updated resonance frequency of the series resonant circuit (reflecting a change in the impedance of the plasma generating region).

In some embodiments, further frequency control processes may be performed to account for additional variations in the series resonant circuit. In this case, the processes performed during blocks 435 and 445 may be performed. Therefore, at block 435, the system controller determines whether a change in impedance has occurred in the plasma generating region while the power is being delivered at the second frequency. As noted before, the change in impedance may be caused by forming or extinguishing a plasma in the plasma generating region, or by modifying one or more plasma process variables, such as temperature, pressure, concentration of gas(es), flow rate, and so forth. The system controller may be able to detect a change in impedance using various sensor measurements such as power, voltage, current, reflected power, and so forth. If no change in impedance has occurred, the method may return to block 425 and continue to provide the RF power signal at the second frequency. However, if a change in impedance is detected, the method proceeds to block 435.

Optionally, at block 445, a third RF power signal having a third frequency, or adjusted frequency, is provided to the series resonant circuit. The system controller may select the third frequency for the RF power signal based on an updated resonance frequency of the series resonant circuit (reflecting a change in impedance of the plasma generating region).

Method 400 generally ends after completing either block 425 or 445. However, the method may be repeated more or less continuously by the system controller, or at discrete time intervals. In one process example, the first frequency is selected to cause a plasma to form in the processing region, the second frequency is selected to control the processing conditions during a first processing step and the third frequency is selected to control the processing conditions during a second processing step. In one example, the processing conditions of the first processing step may require the second frequency selected to be greater than the first frequency, and the third frequency may be selected to differ from one or both of the first and second frequencies. For example, the first frequency may be controlled within a range between about 100 and about 300 kHz, the second frequency may be in a range between about 500 and about 700 kHz, and the third frequency may be controlled within a range that is different than the first or second frequencies. In another example, the processing conditions of the first processing step may require the second frequency selected to be less than the first frequency, and the third frequency may be selected to differ from one or both of the first and second frequencies.

Figure 5:
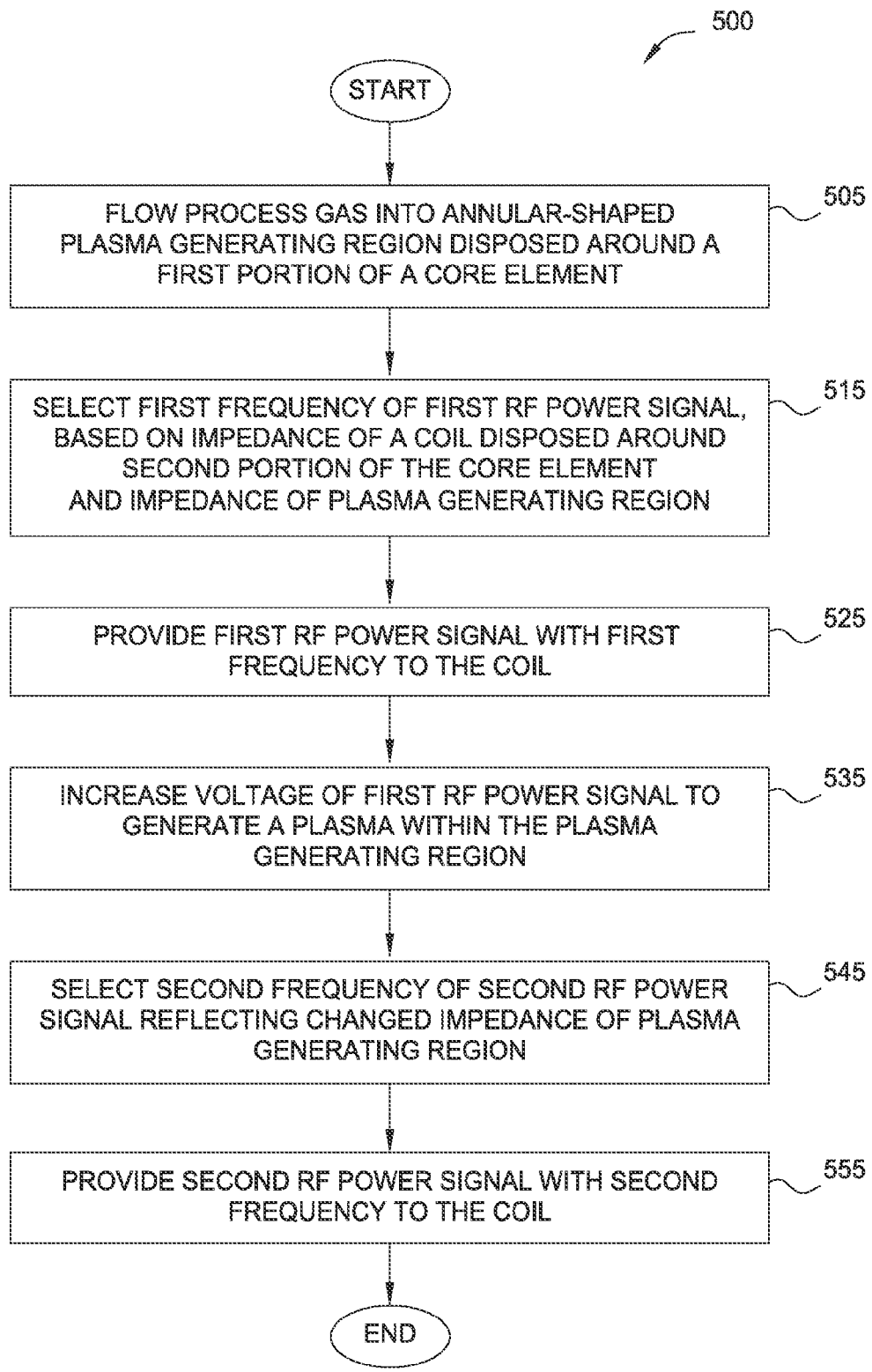
FIG. 5 illustrates a method of forming energetic gas atoms, according to embodiments disclosed herein.

FIG. 5 illustrates a method of forming energetic gas atoms, according to embodiments disclosed herein. Method 500 may generally be used with any of the plasma sources described herein, and may also be applied to other plasma source designs (remote or local) with beneficial effects.

Method 500 begins at block 505, where a process gas is flowed into an annular-shaped plasma generating region disposed around a first portion of a core element. The process gas(es) may be any suitable concentrations of process or cleaning gases for generating a plasma. A system controller may regulate the intake of the process gas(es).

At block 515, a first frequency is selected for a first RF power signal, based on the impedance of a coil disposed around a second portion of the core element, and based on the impedance of the plasma generating region. In some embodiments, the first frequency may be selected at or near a resonance frequency for a series resonant circuit that reflects the impedances of the coil, the plasma generating region of the plasma source, and/or a tuning circuit. The system controller may select the first frequency and control the output of the RF power source. At block 525, the first RF power signal having the first frequency is applied to the coil.

At block 535, the voltage of the first RF power signal is increased to generate a plasma within the plasma generating region. By tuning the RF power signal to the resonance frequency of the series resonant circuit, the impedance of the circuit is at a minimum. Thus, a maximum amount of current may be applied to the coil, and consequently a maximum amount of power may be delivered to energize the atoms of the process gas(es).

At block 545, a second frequency is selected for a second RF power signal reflecting a change in impedance of the plasma generating region. Generally, the change in impedance may be caused by forming the plasma in the plasma generating region. Changes in impedance may also occur for a plasma generating region having a formed plasma by modifying one or more plasma process variables, such as temperature, pressure, concentration of gas(es), flow rate, and so forth. The system controller may be able to detect a change in impedance using various sensor measurements such as power, voltage, current, reflected power, and so forth. The system controller may also select the second frequency for the second RF power signal based on the updated resonance frequency of the series resonant circuit (reflecting the change in impedance of the plasma generating region). At block 555, the second RF power signal having the second frequency is applied to the coil. Method 500 generally ends after completing block 555.

While the foregoing is directed to embodiments of the present disclosure, other and further embodiments of the disclosure may be devised without departing from the basic scope thereof, and the scope thereof is determined by the claims that follow.

What is claimed is:

1. A remote plasma source, comprising:
   a core element extending along a central axis;
   a plasma block including one or more surfaces at least partially enclosing an annular-shaped plasma generating region and disposed around a first portion of the core element;
   one or more coils disposed around respective second portions of the core element; and
   a radio frequency (RF) power source coupled to the one or more coils and configured to drive a RF power signal onto the one or more coils and select a frequency of the RF power signal that is based on a determined impedance of the plasma generating region.

2. The remote plasma source of claim 1, wherein the power source comprises a tuning circuit coupled with the one or more coils, and wherein the power source is configured to select the frequency of the RF power signal based on a resonance frequency of the tuning circuit.

3. The remote plasma source of claim 2, wherein the tuning circuit is a series resonance circuit comprising at least one capacitor disposed in series with the one or more coils.

4. The remote plasma source of claim 1, wherein the frequency of the RF power signal is adjustable from a first frequency prior to forming a plasma in the plasma generating region, to a second frequency after forming the plasma.

5. The remote plasma source of claim 1, wherein the frequency of the power signal is adjustable from a first frequency to a second frequency in response to a change in one or more process variables for a formed plasma in the plasma generating region.

6. The remote plasma source of claim 1, further comprising:
   at least one electrode disposed adjacent to the plasma generating region; and
   a second RF power source configured to drive a second RF power signal onto the electrode to couple energy with the plasma generating region.

7. The remote plasma source of claim 6, wherein the second RF power source is further configured to drive the second RF power signal prior to forming a plasma in the plasma generating region.

8. The remote plasma source of claim 1, further comprising at least one cooling plate configured to remove heat from the plasma block during operation.

9. The remote plasma source of claim 8, further comprising:
   a second RF power source configured to drive a second RF power signal onto the cooling plate to couple energy with the plasma generating region.

10. The remote plasma source of claim 1, further comprising an actuator coupled with the core element and configured to adjust a position of the core element relative to the plasma generating region.

11. A method of controlling plasma generation using a remote plasma source comprising a core element, wherein an annular-shaped plasma generating region is disposed around a first portion of the core element, the method comprising:
    delivering a radio frequency (RF) power signal having a first frequency to one or more coils disposed around a second portion of the core element; and
    upon determining a change of impedance of the plasma generating region, changing the frequency of the delivered RF power signal from the first frequency to a second frequency.

12. The method of claim 11, further comprising forming a plasma in the plasma generating region using the RF power signal, wherein the change of impedance is caused by forming the plasma.

13. The method of claim 11, wherein the change of impedance is caused by changing one or more process variables for a formed plasma in the plasma generating region.

14. The method of claim 11, wherein the first and second frequencies are each selected as series resonance frequencies based on impedances of the coils, the plasma generating region, and a tuning circuit comprising one or more capacitors.

15. The method of claim 11, further comprising:
    upon determining a change of impedance of the plasma generating region, changing an amplitude of the delivered RF power signal.

16. The method of claim 11, wherein the plasma source further comprises a plasma block having one or more surfaces that at least partially enclose the plasma generating region, and a cooling plate configured to remove heat from the plasma block during operation, the method further comprising:
    delivering, prior to forming a plasma in the plasma generating region, a second RF power signal to the cooling plate to thereby couple energy with the plasma generating region.

17. A method of forming energetic gas atoms, comprising:
    flowing a process gas into an annular-shaped plasma generating region that is at least partially enclosed by one or more surfaces of a first plasma block, wherein the plasma generating region is disposed around a first portion of a core element;
    delivering a radio frequency (RF) power signal to a coil disposed around a second portion of the core element, wherein the RF power signal has a first frequency selected to match a first resonance frequency based on impedances of the coil and the plasma generating region, wherein energy from the RF power signal is coupled with the plasma generating region via the coil and the core element;
    increasing an amplitude of the delivered RF power signal to form a plasma within the plasma generating region; and
    adjusting the frequency of the delivered RF power signal to a second frequency selected to match a second resonance frequency reflecting a changed impedance of the plasma generating region caused by the formed plasma.

18. The method of claim 17, further comprising adjusting the amplitude of the delivered RF power signal responsive to forming the plasma.

19. The method of claim 17, further comprising:
    delivering, prior to forming the plasma, a second RF power signal onto at least one electrode disposed adjacent to the plasma generating region, thereby coupling energy into the plasma generating region.

* * * * *